(12) United States Patent
Yoshikawa et al.

(10) Patent No.: US 8,647,908 B2
(45) Date of Patent: Feb. 11, 2014

(54) SEMICONDUCTOR PRESSURE SENSOR AND METHOD OF MANUFACTURING SEMICONDUCTOR PRESSURE SENSOR

(75) Inventors: Eiji Yoshikawa, Chiyoda-ku (JP); Shinichi Izuo, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/413,846

(22) Filed: Mar. 7, 2012

(65) Prior Publication Data
US 2013/0105922 A1    May 2, 2013

(30) Foreign Application Priority Data
Oct. 28, 2011 (JP) .................... 2011-237485

(51) Int. Cl.
*H01L 21/62* (2006.01)
*H01L 29/84* (2006.01)

(52) U.S. Cl.
USPC .......... 438/53; 438/50; 438/51; 438/401; 257/419; 257/E29.324; 257/E21.52

(58) Field of Classification Search
USPC .......... 438/50–53; 257/419, E29.324, E21.52
See application file for complete search history.

(56) References Cited

U.S. PATENT DOCUMENTS

| | | | | |
|---|---|---|---|---|
| 4,744,863 | A * | 5/1988 | Guckel et al. ............... | 438/53 |
| 4,766,666 | A * | 8/1988 | Sugiyama et al. .......... | 29/621.1 |
| 4,975,390 | A * | 12/1990 | Fujii et al. .................. | 438/53 |
| 5,335,550 | A * | 8/1994 | Satou ............................ | 73/727 |
| 5,632,854 | A * | 5/1997 | Mirza et al. ................. | 438/53 |
| 5,759,870 | A * | 6/1998 | Yun et al. .................... | 438/53 |
| 6,912,759 | B2 * | 7/2005 | Izadnegahdar et al. ...... | 29/25.35 |
| 6,967,145 | B2 * | 11/2005 | Tseng et al. ................. | 438/401 |
| 7,248,131 | B2 * | 7/2007 | Fazzio et al. ................ | 333/187 |
| 8,293,557 | B2 * | 10/2012 | Inoue et al. ................. | 438/50 |
| 2002/0053242 | A1 * | 5/2002 | Tai et al. ..................... | 73/754 |
| 2009/0007413 | A1 * | 1/2009 | Jafri et al. ................... | 29/594 |

FOREIGN PATENT DOCUMENTS

| | | |
|---|---|---|
| JP | 01-112725 | 5/1989 |
| JP | 04-62877 | 2/1992 |
| JP | 04-124881 | 4/1992 |
| JP | 05-190873 | 7/1993 |
| JP | 05-283712 | 10/1993 |
| JP | 10-132680 | 5/1998 |
| JP | 10-321875 | 12/1998 |
| JP | 2000-124466 | 4/2000 |

OTHER PUBLICATIONS

Office Action issued Jul. 23, 2013 in Japanese Patent Application No. 2011-237485 w/English Translation.

* cited by examiner

*Primary Examiner* — Angel Roman
(74) *Attorney, Agent, or Firm* — Oblon, Spivak, McClelland, Maier & Neustadt, L.L.P.

(57) ABSTRACT

A semiconductor pressure sensor includes a first substrate having a concave portion and an alignment mark at a main surface thereof, and a second substrate formed on the main surface of the first substrate and having a diaphragm provided to cover a space inside the concave portion of the first substrate and a gauge resistor provided on the diaphragm. The alignment mark is provided to be exposed from the second substrate. Accordingly, it is possible to obtain a semiconductor pressure sensor and a method of manufacturing the same with reduced production costs and with improved pressure measuring accuracy.

8 Claims, 6 Drawing Sheets

SEMICONDUCTOR PRESSURE SENSOR AND METHOD OF MANUFACTURING SEMICONDUCTOR PRESSURE SENSOR

BACKGROUND OF THE INVENTION

1. Field of the Invention

The present invention relates to a semiconductor pressure sensor and a method of manufacturing a semiconductor pressure sensor, and more particularly to a semiconductor pressure sensor having a gauge resistor and a method of manufacturing a semiconductor pressure sensor.

2. Description of the Background Art

Conventionally proposed is a semiconductor pressure sensor including a diaphragm and a reference pressure chamber formed by bonding a flat plate-like silicon substrate and a silicon substrate having a concave portion.

For example, Japanese Patent Laying-Open No. 2000-124466 proposes a semiconductor pressure sensor including a diaphragm and a reference pressure chamber. In the semiconductor pressure sensor described in this publication, a first silicon substrate in the shape of a flat plate and a second silicon substrate having a concave portion are bonded with an oxide film formed on a surface of the first silicon substrate being interposed therebetween. The concave portion is sealed by the first silicon substrate to form a reference pressure chamber. Then, the second silicon substrate is ground to form a diaphragm at a portion that covers the concave portion of the second silicon substrate. Gauge resistors are formed at prescribed positions of the diaphragm.

In one method of manufacturing a semiconductor pressure sensor as described in the publication above, an alignment mark (first alignment mark) is formed simultaneously with the concave portion at a first surface of the second silicon substrate that is to be bonded to the first silicon substrate. Registration is performed with respect to the first alignment mark using an IR (infrared) aligner, so that an alignment mark concave portion (second alignment mark) is formed at a second surface opposite to the first surface of the second silicon substrate. Registration is performed with respect to the second alignment mark using a stepper, so that gauge resistors are formed at prescribed positions of the diaphragm.

In another manufacturing method described in the publication above, a first alignment mark is formed to pass through the second silicon substrate. Registration is performed with respect to the first alignment mark using a stepper, so that a second alignment mark is formed at the second surface of the second silicon substrate. Gauge resistors are thereafter formed in the same way as the one manufacturing method above.

In one method of manufacturing a semiconductor pressure sensor described in the publication above, the concave portion cannot be visually identified because the concave portion is shielded by the first and second silicon substrates. Therefore, the accurate position of the diaphragm covering the concave portion cannot be visually identified, either. Then, gauge resistors are formed at prescribed positions of the diaphragm using an alignment mark. An IR aligner is used to recognize the first alignment mark since the first alignment mark cannot be visually identified. A stepper having an IR alignment function is used as the IR aligner. However, steppers having the IR alignment function are extremely scarce. Even in the environment in which a stepper having the IR alignment function is available, the frequency of use of the IR alignment function is generally very low. Therefore, capital investment efficiency is decreased and the unit cost per process is increased. Accordingly, the production cost is increased.

In order to match the thickness of the diaphragm with the desired thickness, it is necessary to measure the thickness of the diaphragm or the second silicon substrate, for example, by a light interference measuring method while grinding the second silicon substrate. However, the amount of grinding the second silicon substrate varies. In addition, many concave portions, which are formed in the second substrate, vary in depth. Therefore, the thickness of the diaphragm varies significantly. Therefore, another problem is that it is difficult to finish the thickness of the diaphragm as desired with a good yield. Accordingly, the pressure measuring accuracy is reduced.

In another method of manufacturing a semiconductor pressure sensor as described in the publication above, the first alignment mark is formed to pass through the second silicon substrate including the concave portion and the diaphragm. The second silicon substrate has a thickness of at least 10 μm or more. Therefore, in order to form the first alignment mark, the second silicon substrate must be etched at least 10 μm or more from the first surface which is the bonding interface. This requires time and cost. Accordingly, the production cost is increased.

Furthermore, it is difficult to ensure the pattern accuracy of the alignment mark at the second surface of the second silicon substrate since the first alignment mark must be etched deeply to pass through the silicon substrate from the first surface of the second silicon substrate. Therefore, there is another problem of deterioration of the alignment accuracy. Accordingly, the pressure measuring accuracy is reduced.

In both of one and another methods of manufacturing a semiconductor device described in the publication above, gauge resistors are formed with reference to the second alignment mark registered based on the first alignment mark. Therefore, there is a problem that the registration accuracy of the gauge resistors is reduced as compared with when the gauge resistors are formed based on the first alignment mark without the second alignment mark. Accordingly, the pressure measuring accuracy is reduced.

Now, the method of etching a silicon substrate to form a concave portion, etc. mainly includes dry etching and wet etching. With either method, a minute amount of metal elements may contaminate a silicon substrate during etching or during cleaning after etching. In a semiconductor pressure sensor, a gauge resistor is formed by introducing an impurity in a silicon substrate by ion implantation, etc. The metal contamination may lead to variations in characteristics of the gauge resistor and reduction in reliability.

Supposing that the metal elements are unintentionally introduced into the silicon substrate in the step of forming the concave portion, the metal elements move in the silicon substrate when the silicon substrate is processed at high temperatures of 1000° C. or higher in the subsequent thermal processing step. Therefore, with such a configuration as the semiconductor pressure sensor described in the publication above in which a concave portion is formed in the second silicon substrate on which gauge resistors are to be formed, the movement of metal elements described above occurs in the thermal processing step carried out after bonding between the second silicon substrate and the first silicon substrate, so that the metal elements intrude into the inside of the gauge resistors. As a result, the characteristics of the gauge resistors vary, or the reliability is reduced. Accordingly, the pressure measuring accuracy is reduced.

SUMMARY OF THE INVENTION

The present invention is made in view of the problems as described above. An object of the present invention is to provide a semiconductor pressure sensor and a method of manufacturing the same with reduced production costs and with improved pressure measuring accuracy.

A semiconductor pressure sensor according to the present invention includes a first substrate having a concave portion and an alignment mark at a main surface thereof, and a second substrate formed on the main surface of the first substrate and having a diaphragm provided to cover a space inside the concave portion of the first substrate and a gauge resistor provided on the diaphragm. The alignment mark is provided to be exposed from the second substrate.

In the semiconductor pressure sensor of the present invention, the first substrate has a concave portion and an alignment mark, and the second substrate has a gauge resistor. In other words, the second substrate, which is different from the first substrate having the concave portion and the alignment mark, has the gauge resistor. Therefore, it is possible to prevent metal contamination in the first substrate during formation of the concave portion and the alignment mark from spreading to the gauge resistor in the second substrate. Therefore, characteristic variations of the gauge resistor and reduction in reliability can be prevented. Accordingly, the pressure measuring accuracy can be improved.

Furthermore, the diaphragm can be provided by grinding the second substrate without being affected by variation in the depth of the concave portion, because the first substrate has the concave portion and the second substrate has the diaphragm. Thus, the accuracy in thickness of the diaphragm can be improved. Accordingly, the pressure measuring accuracy can be improved.

In addition, the alignment mark can be visually identified because the alignment mark is exposed from the second substrate. This eliminates the need of an IR aligner. Accordingly, the production cost can be reduced.

In addition, the pattern accuracy of alignment can be ensured, and the alignment accuracy is therefore not reduced, because the first substrate has the alignment mark at the main surface. Thus, the registration accuracy for the gauge resistor can be improved. Accordingly, the pressure measuring accuracy can be improved.

In addition, the cost and time required to form the alignment mark can be reduced as compared with when the alignment mark is formed to pass through the second substrate, because the first substrate has the alignment mark at the main surface. Accordingly, the production cost can be reduced.

In addition, the registration accuracy for the gauge resistor can be improved by using the alignment mark as a reference for registering the gauge resistor, because the first substrate has the alignment mark at the main surface. Accordingly, the pressure measuring accuracy can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, an embodiment of the present invention will be described based on the figures.

First of all, a structure of a semiconductor pressure sensor in an embodiment of the present invention will be described.

Figure 1:
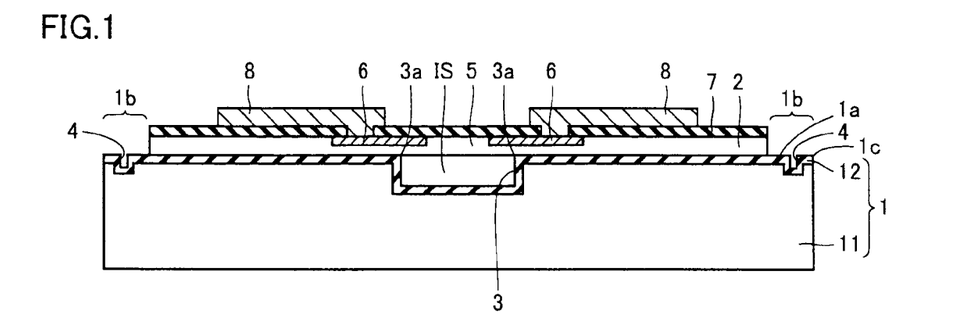
FIG. 1 is a schematic cross-sectional view of a semiconductor pressure sensor in an embodiment of the present invention.

Referring to FIG. 1, a semiconductor pressure sensor in an embodiment of the present invention mainly includes a first substrate 1, a second substrate 2, an oxide film 7, and metal wiring 8. Second substrate 2 is joined to first substrate 1. First substrate 1 and second substrate 2 are, for example, silicon substrates.

First substrate 1 has a substrate body 11 and an oxide film 12. Oxide film 12 is formed surrounding substrate body 11. In other words, oxide film 12 is formed on a surface of first substrate 1. First substrate 1 has a concave portion 3 and alignment marks 4 at a main surface 1a. Concave portion 3 is arranged at the central portion of main surface 1a. Alignment marks 4 are provided to be exposed from second substrate 2. Alignment marks 4 are arranged at opposite ends of main surface 1a. It is noted that alignment mark 4 may be arranged at least one of the opposite ends of main surface 1a.

Second substrate 2 is formed on main surface 1a of first substrate 1. Second substrate 2 has a diaphragm 5. Diaphragm 5 is provided to cover a space IS in concave portion 3 of first substrate 1. The portion of second substrate 2 that covers space IS in concave portion 3 of first substrate 1 forms diaphragm 5. Diaphragm 5 and concave portion 3 constitute a reference pressure chamber. It is noted that a concave portion and an alignment mark are not formed in second substrate 2.

Second substrate 2 has gauge resistors 6. Gauge resistors 6 are provided on diaphragm 5. Gauge resistors 6 are arranged at positions overlapping with outer edges 3a of concave portion 3 as viewed from the direction in which first substrate 1 and second substrate 2 overlap each other. Gauge resistors 6 are formed to be able to detect strain of second substrate 2. The semiconductor pressure sensor is configured such that pressure is detected by gauge resistors 6 detecting strain of second substrate 2. For example, in a case where second substrate 2 is an n-type silicon substrate, a p-layer of a pn diode formed in the n-type silicon substrate is used as gauge resistor 6.

Oxide film 7 is formed on second substrate 2. Gauge resistor contact holes are formed in oxide film 7 so as to partially expose gauge resistors 6. Metal wiring 8 is formed on oxide film 7 to fill in the gauge resistor contact holes. Metal wiring 8 is formed in contact with gauge resistors 6. Metal wiring 8 is electrically connected with gauge resistors 6. Metal wiring 8 is configured such that a resistance change of gauge resistor 6 due to deformation of diaphragm 5 can be externally taken out as an electrical signal.

The semiconductor pressure sensor having the first substrate in a wafer state will now be described.

Figure 2:
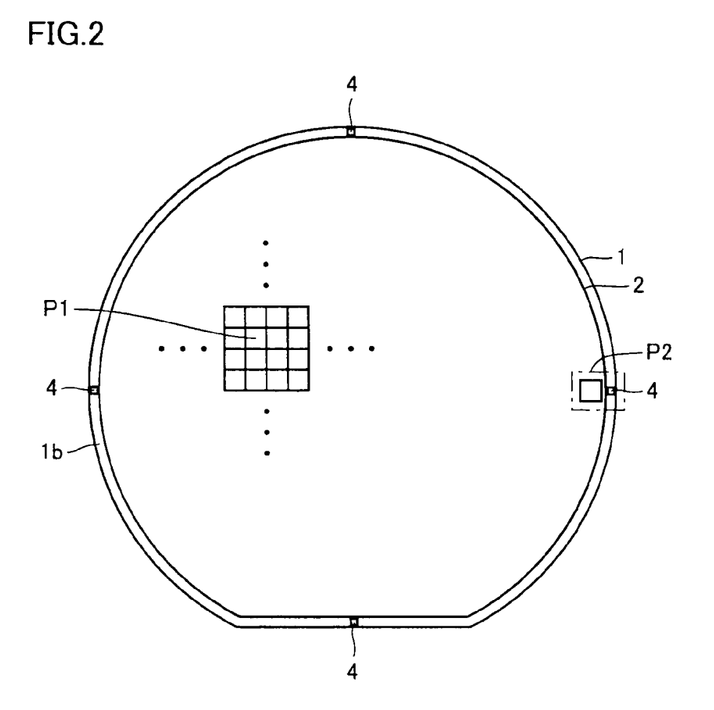
FIG. 2 is a schematic plan view of the semiconductor pressure sensor in which a first substrate is in a wafer state in an embodiment of the present invention.
Figure 3:
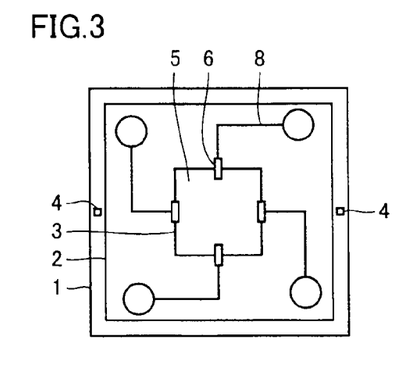
FIG. 3 is an enlarged view of the semiconductor pressure sensor, showing a P1 portion in FIG. 2.
Figure 4:
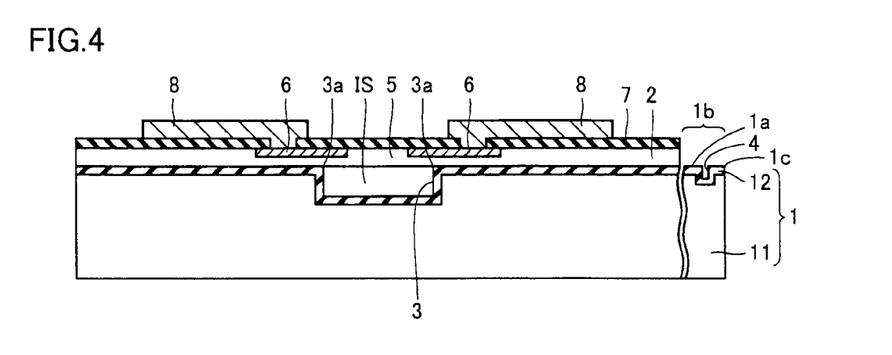
FIG. 4 is a schematic cross-sectional view of the semiconductor pressure sensor, showing a P2 portion in FIG. 2.

Referring to FIG. 2 and FIG. 3, a number of semiconductor pressure sensors are formed in semiconductor substrate 1 in a wafer state. A semiconductor pressure sensor shown in FIG. 3 is formed by cutting out a semiconductor pressure sensor shown by a P1 portion in FIG. 2. The semiconductor pressure sensor shown in FIG. 3 corresponds to the semiconductor pressure sensor shown in FIG. 1. Alignment marks 4 are provided at an outer peripheral portion 1b of first substrate 1 in a wafer state. For example, four alignment marks 4 are provided at positions 90° away from each other. Referring to FIG. 4, a semiconductor pressure sensor shown by a P2 portion in FIG. 2 has one alignment mark 4 provided at outer peripheral portion 1b of first substrate 1.

Alignment marks 4 may be provided only at outer peripheral portion 1b of first substrate 1 in a wafer state. Generally, in an SOI (Silicon On Insulator) substrate manufactured by bonding two silicon substrates together, the reliability of bonding is reduced at the outer peripheral portions of the silicon substrates. Therefore, the outer peripheral portion of the silicon substrate that is thinly ground is removed. Outer peripheral portion 1b forms a terrace portion. The width of the terrace portion is approximately 1 mm or more and 5 mm or less.

In general, an area about 5 mm from the outer circumferential end of a silicon substrate is not used since effective electric circuits cannot be formed there in a semiconductor wafer process. In other words, an area about 5 mm from the outer circumferential end of a silicon substrate does not form an effective area in which effective chips are arranged. The number of effective chips can be maximized by forming alignment marks only at the terrace portion which is not an effective area. Therefore, the number of effective chips can be increased by providing alignment marks 4 only at outer peripheral portion 1b of first substrate 1 in a wafer state as compared with when alignment marks 4 are provided at regular intervals on the entire main surface 1a of first substrate 1.

A method of manufacturing a semiconductor pressure sensor in an embodiment of the present invention will now be described. In the following, a single semiconductor pressure sensor will be described as an example, for convenience of explanation, although a number of semiconductor pressure sensors are simultaneously manufactured on a wafer.

Figure 5:
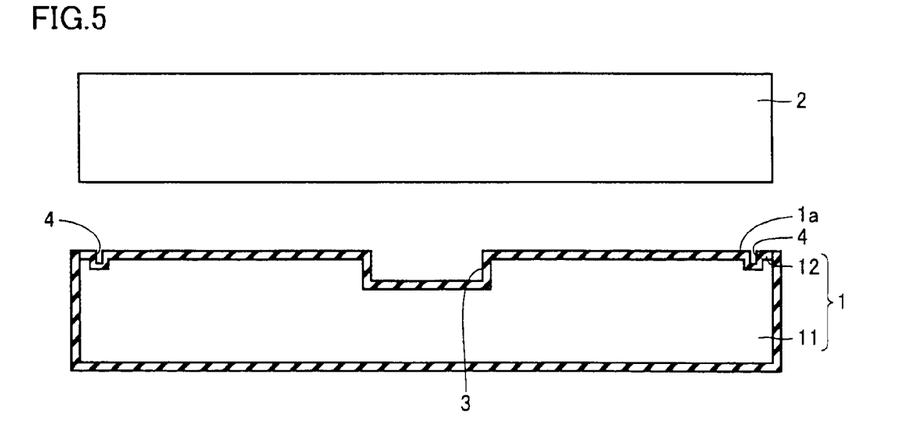
FIG. 5 to FIG. 12 are schematic cross-sectional views sequentially showing the steps in a method of manufacturing a semiconductor pressure sensor in an embodiment of the present invention.

Referring to FIG. 5, first substrate 1 having concave portion 3 and alignment marks 4 formed at main surface 1a is prepared. First, alignment marks 4 are formed at main surface 1a of first substrate 1. Alignment marks 4 may be formed at outer peripheral portion 1b (FIG. 1) of first substrate 1 in a wafer state. The width of outer peripheral portion 1b may be 5 mm or less from the outer circumferential end of outer peripheral portion 1b of first substrate 1 in a wafer state. Alignment marks 4 are used for registration when gauge resistors 6, etc. are formed later. Alignment mark 4 has a shape determined by a stepper so as to allow use of a stepper. Alignment marks 4 are formed by etching first substrate 1, preferably, using a plasma etching device, etc. Alignment marks 4 do not have to be etched deeply as long as they can be visually identified with a stepper, and a depth of about 1 μm will suffice.

Registration is performed, for example, by a stepper with reference to alignment marks 4, so that concave portion 3 is formed on main surface 1a. Concave portion 3 subsequently serves as a reference pressure chamber as a pressure sensor, and the depth thereof is thus desirably about 5 to 100 μm and can be set relatively arbitrarily within this range. As the depth of concave portion 3 is shallower, the processing load is reduced, but the capacity of the reference pressure chamber is reduced to increase pressure variations due to minute leak, that is, output variations. The depth of concave portion 3 is chosen considering this trade-off relation. To form this concave portion 3, a plasma etching device may be used in the same way as alignment marks 4. However, considering that the depth is somewhat as deep as 5 μm or more, a deep RIE (Reactive Ion Etching) device may be used through a Bosch process. Alternatively, instead of dry etching using a plasma etching device and a deep RIE device, wet etching using alkaline etching liquid such as TMAH (tetramethylammonium hydroxide) may be used.

Concave portion 3 and alignment marks 4 may be formed simultaneously. In the case where concave portion 3 and alignment marks 4 are formed simultaneously, concave portion 3 and alignment marks 4 can be subjected to photolithography simultaneously using the same photo mask. Therefore, the alignment accuracy (positional accuracy) of concave portion 3 can significantly be increased.

Oxide film 12 is thereafter formed on a surface of first substrate 1. After concave portion 3 and alignment marks 4 are formed, first substrate 1 is thermally oxidized to form oxide film 12 on the entire wafer surface. The thickness of oxide film 12 is suitably about 0.2 to 1 μm.

Figure 6:
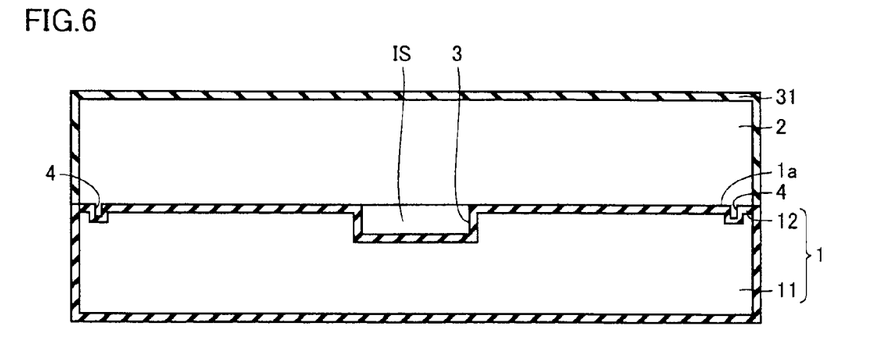

Next, referring to FIG. 6 to FIG. 10, second substrate 2 is formed on main surface 1a of first substrate 1 so as to have diaphragm 5 covering space IS in concave portion 3 and to expose alignment marks 4. Referring to FIG. 6, first, second substrate 2 is bonded to main surface 1a of first substrate 1 to seal concave portion 3. First substrate 1 and second substrate 2 are laid on one another for vacuum evacuation and are thermally oxidized under the environment of about 1100° C. to be bonded to each other. Thus, the reference pressure chamber is hermetically sealed.

If metal elements are unintentionally introduced into the first substrate during formation of concave portion 3 and alignment marks 4, even if the metal elements move under a high temperature during joining between first substrate 1 and second substrate 2, the metal elements are trapped in oxide film 12 and stay in first substrate 1 and do not intrude into second substrate 2.

Figure 7:
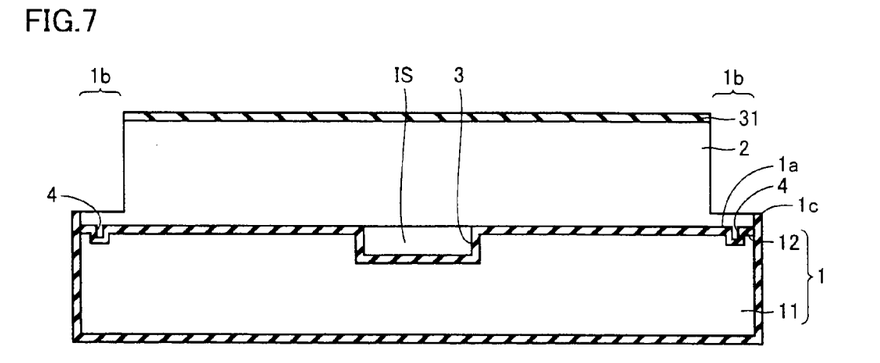

Referring to FIG. 7, outer peripheral portion 1b of second substrate 2 is ground, for example, by a grinder. The thickness of second substrate 2 is not entirely ground but ground such that a small amount of the thickness is left. This prevents alignment marks 4 from disappearing due to grinding of second substrate 2 and further grinding of even first substrate 1.

Figure 8:
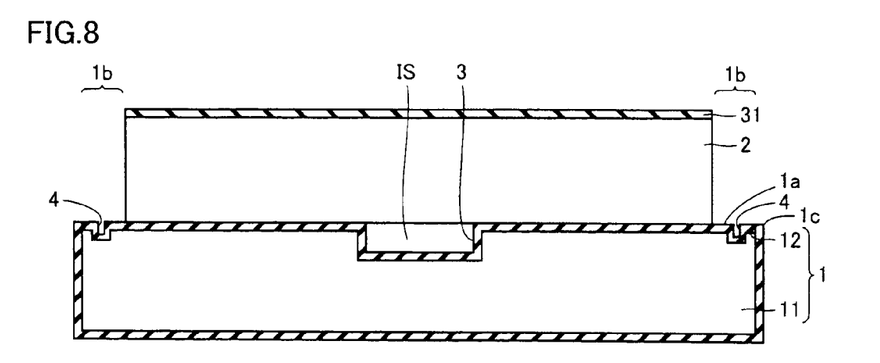

Referring to FIG. 8, after outer peripheral portion 1b of second substrate 2 is ground, second substrate 2 left at outer peripheral portion 1b is completely removed by etching. In this etching, alkaline etching liquid such as TMAH that only etches silicon and does not etch oxide films is preferably used. Thus, alignment marks 4 covered with oxide film 12 are not etched. As a result of this step, outer peripheral portion 1b serving as the terrace portion is completed, and alignment marks 4 are exposed so as to be visually identified.

Figure 9:
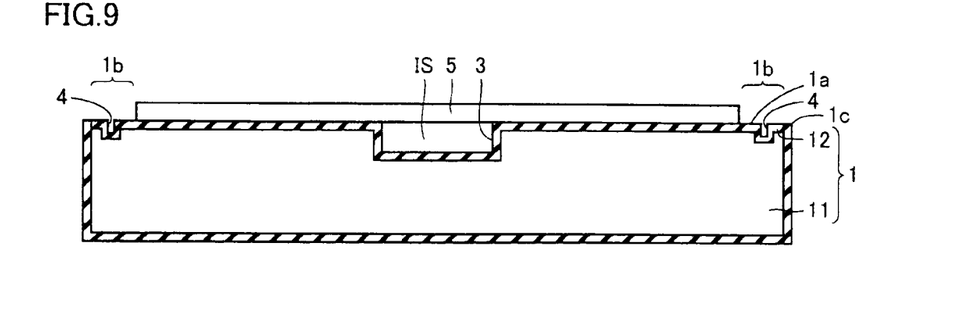

Referring to FIG. 9, second substrate 2 is ground to be thinned. In addition, in order to finish the surface in a mirrorsmooth state, polishing is performed, for example, by CMP (Chemical Mechanical Polishing). Diaphragm 5 is thus completed.

Although the size and thickness of diaphragm 5 depends on pressure to be measured, the size can be set to 100 to 500 μm and the thickness can be set to 5 to 20 μm, if pressures of 1 to 5 atmospheres are to be measured.

In the foregoing description, diaphragm 5 is formed by grinding second substrate 2 to the desired thickness after outer peripheral portion 1b serving as the terrace portion is formed. However, outer peripheral portion 1b serving as the terrace portion may be formed after diaphragm 5 is formed by grinding second substrate 2 to the desired thickness.

Figure 10:
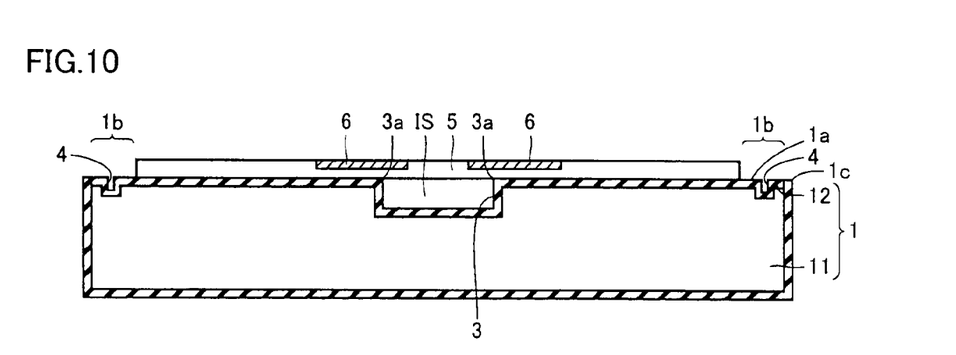

Referring to FIG. 10, gauge resistors 6 are thereafter formed on diaphragm 5 using the exposed alignment marks 4. Registration is performed with respect to the exposed alignment marks 4 using a stepper, so that gauge resistors 6 are formed at prescribed positions of diaphragm 5. Oxide film 7 is then formed on second substrate 2.

Figure 11:
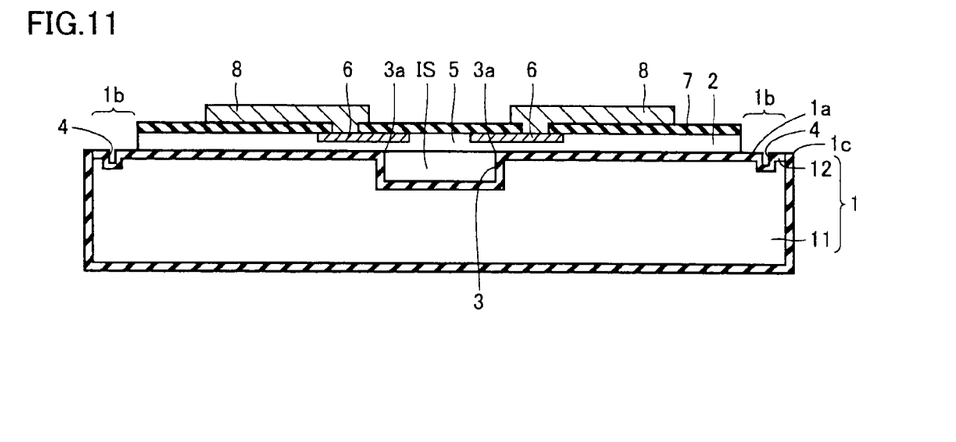

Referring to FIG. 11, registration is thereafter performed with respect to the exposed alignment marks 4 using a stepper, so that gauge resistor contact holes are formed at prescribed positions of oxide film 7. Then, metal wiring 8 electrically connected to gauge resistors 6 is formed using the exposed alignment marks 4. Registration is performed with reference to the exposed alignment marks 4 using a stepper, so that metal wiring 8 is formed at prescribed positions to fill in the gauge resistor contact holes.

Figure 12:
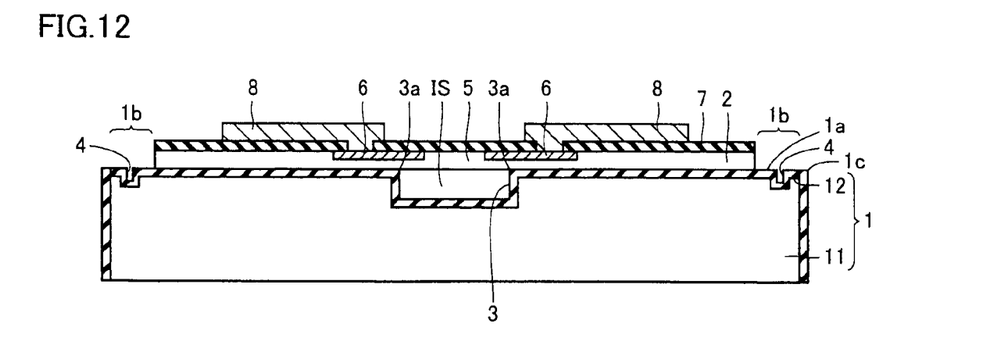

Referring to FIG. 12, the back surface on the side opposite to main surface 1a of first substrate 1 is ground to remove the unnecessary oxide film. Thus, a pressure sensor wafer is completed. The unnecessary oxide film on the side surface of first substrate 1 is additionally removed, whereby the semiconductor pressure sensor shown in FIG. 1 is produced.

In an embodiment of the present invention, both concave portion 3 and gauge resistors 6 can be formed using a stepper with respect to alignment marks 4, so that gauge resistors 6 are formed with high accuracy at prescribed positions of diaphragm 5 provided to cover concave portion 3.

The operation and effects of the embodiment of the present invention will be described in comparison with comparative examples.

Figure 13:
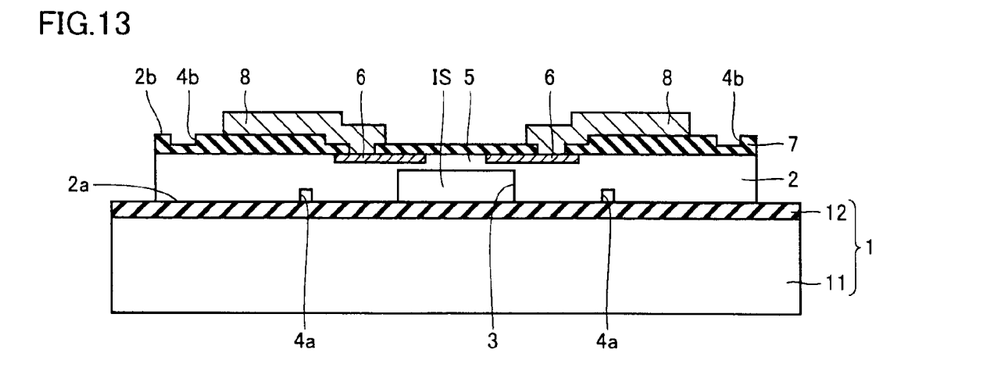
FIG. 13 is a schematic cross-sectional view of a semiconductor pressure sensor of a first comparative example in an embodiment of the present invention.

Referring to FIG. 13, in a semiconductor pressure sensor in a first comparative example in an embodiment of the present invention, first alignment marks 4a are formed at a first surface 2a of second substrate 2. First alignment marks 4a cannot be visually identified from the second surface 2b side since they are formed at first surface 2a of second substrate 2. Therefore, an IR aligner is used to recognize first alignment marks 4a. Accordingly, the use of an IR aligner increases the production cost.

Figure 14:
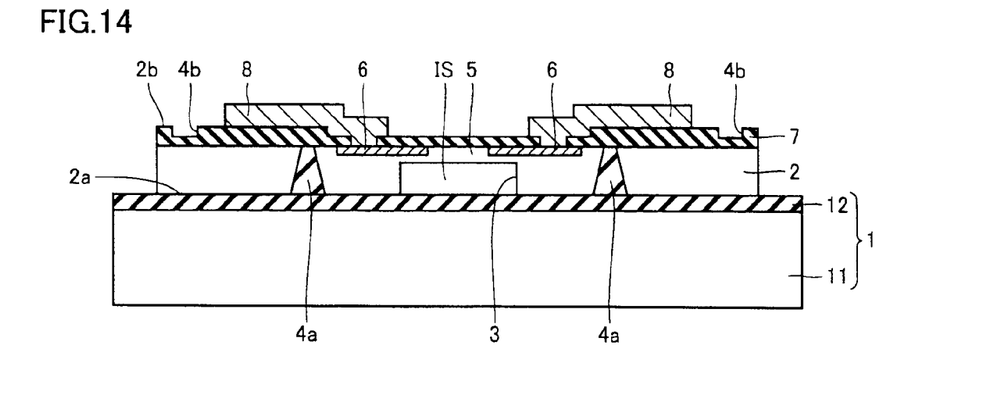
FIG. 14 is a schematic cross-sectional view of a semiconductor pressure sensor of a second comparative example in an embodiment of the present invention.

Referring to FIG. 14, in a semiconductor pressure sensor in a second comparative example in an embodiment of the present invention, first alignment marks 4a are formed to pass through second substrate 2. Second substrate 2 has a thickness larger than the thickness of first alignment mark 4a provided at the surface of second substrate 2 as in the first comparative example because concave portion 3 and diaphragm 5 are formed in second substrate 2. Therefore, as compared with the case where first alignment marks 4a are formed at the surface of second substrate 2 as in the semiconductor pressure sensor of the first comparative example, longer time and higher cost are required to form first alignment marks 4a in the semiconductor pressure sensor of the second comparative example, thereby increasing the production cost.

In addition, it is necessary to deeply etch second substrate 2 since first alignment marks 4a are formed to pass through second substrate 2 from first surface 2a to second surface 2b. In this etching, through holes are formed in second substrate 2 so as to be tapered from first surface 2a toward second surface 2b. First alignment marks 4a are formed in the through holes. Therefore, the shape of first alignment mark 4a deteriorates at second surface 2h as compared with at first surface 2a. Therefore, the alignment accuracy is reduced. Accordingly, the pressure measuring accuracy is reduced.

Both in the first and second comparative examples, the thickness of diaphragm 5 considerably varies depending on variations in the amount of grinding second substrate 2 and variations in the depth of concave portion 3. Therefore, it is difficult to finish the thickness of diaphragm 5 as desired with a good yield. Accordingly, the pressure measuring accuracy is reduced.

Furthermore, in both the first and second comparative examples, concave portion 3 and gauge resistors 6 are formed in second substrate 2. Therefore, metal contamination during formation of concave portion 3 in second substrate 2 causes variations in characteristics of gauge resistors 6 and reduces reliability.

Figure 15:
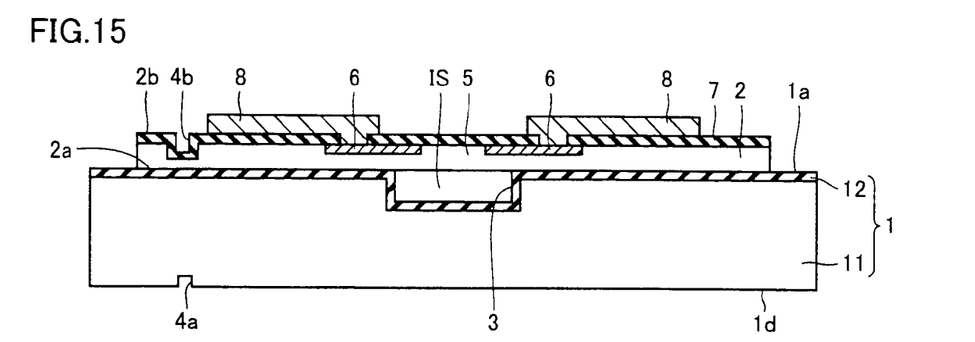
FIG. 15 is a schematic cross-sectional view of a semiconductor pressure sensor of a third comparative example in an embodiment of the present invention.

Referring to FIG. 15, in a semiconductor pressure sensor in a third comparative example in an embodiment of the present invention, a first alignment 4a is formed on a surface 1d of first substrate 1 that does not serve as a bonding interface. Concave portion 3 is formed at main surface 1a with respect to this first alignment mark 4a using a double-sided aligner. Then, first substrate 1 and second substrate 2 are bonded together to seal concave portion 3. Diaphragm 5 is thereafter formed by grinding second substrate 2. Then, a second alignment mark 4b is formed at second surface 2h of second substrate 2 with respect to first alignment mark 4a using a double-sided aligner. Gauge resistors 6 are formed with reference to this second alignment mark 4b.

In a method of manufacturing the semiconductor pressure sensor of the third comparative example, an IR aligner in the first comparative example is unnecessary, and first alignment mark 4a passing through second substrate 2 in the second comparative example is also unnecessary. However, a double-sided aligner having registration accuracy lower than a stepper is used twice. Therefore, the registration accuracy for gauge resistors 6 is only achieved to such a degree that the registration by the double-sided aligner having essentially low registration accuracy is repeated twice. Accordingly, the pressure measuring accuracy is reduced.

In all of the first to third comparative examples, gauge resistors 6 are formed with reference to second alignment mark 4b registered based on first alignment mark 4a. Therefore, the positional accuracy of gauge resistors 6 is reduced as compared with the case where gauge resistors 6 are formed based on first alignment mark 4a without second alignment mark 4b.

In the semiconductor pressure sensor in an embodiment of the present invention, first substrate 1 has concave portion 3 and alignment mark 4, and second substrate 2 has gauge resistor 6. Therefore, second substrate 2, which is different from first substrate 1 having concave portion 3 and alignment mark 4, has gauge resistor 6. Therefore, it is possible to prevent metal contamination in first substrate 1 during formation of concave portion 3 and alignment mark 4 from spreading to gauge resistor 6 in second substrate 2. Thus, characteristic variations of gauge resistor 6 and reduction in reliability can be prevented. Accordingly, the pressure measuring accuracy can be improved.

Furthermore, diaphragm 5 can be provided by grinding second substrate 2 without being affected by variations in the depth of concave portion 3 because first substrate 1 has concave portion 3 and second substrate 2 has diaphragm 5. Therefore, the accuracy in thickness of diaphragm 5 can be improved. Accordingly, the pressure measuring accuracy can be improved.

In addition, alignment mark 4 can be visually identified because alignment mark 4 is exposed from second substrate 2. This eliminates the need of an IR aligner. Accordingly, the production cost can be reduced.

In addition, the pattern accuracy of alignment mark 4 can be ensured, and the alignment accuracy is therefore not reduced, because first substrate 1 has alignment mark 4 at main surface 1a. Thus, the registration accuracy for gauge resistor 6 can be improved. Accordingly, the pressure measuring accuracy can be improved.

In addition, the cost and time required to form alignment mark 4 can be reduced as compared with when alignment mark 4 is formed to pass through second substrate 2, because first substrate 1 has alignment mark 4 at main surface 1a. Accordingly, the production cost can be reduced.

In addition, the registration accuracy for gauge resistor 6 can be improved by using alignment mark 4 as the registration reference for gauge resistor 6, because first substrate 1 has alignment mark 4 at main surface 1a. Accordingly, the pressure measuring accuracy can be improved. In particular, the improvement of positional accuracy of gauge resistor 6 with respect to diaphragm 5 can reduce variations of sensor output at a pressure of zero (that is, offset output).

In the semiconductor pressure sensor in an embodiment of the present invention, alignment mark 4 is provided at outer peripheral portion 1b of first substrate 1 in a wafer state. Therefore, the provision of alignment mark 4 at outer peripheral portion 1b that is not an effective area can increase the number of effective chips.

In the semiconductor pressure sensor in an embodiment of the present invention, gauge resistor 6 is arranged at a position overlapping with outer edge 3a of concave portion 3 as viewed from the direction in which first substrate 1 and second substrate 2 overlap each other. Therefore, the arrangement of gauge resistor 6 at an area in which stress is increased can increase a resistance change of gauge resistor 6. Accordingly, the pressure measuring accuracy can be improved.

In the method of manufacturing a semiconductor pressure sensor in an embodiment of the present invention, it is possible to prevent characteristics variations of gauge resistor 6 and reduction in reliability due to metal contamination during formation of concave portion 3 and alignment mark 4, because concave portion 3 and alignment mark 4 are formed in first substrate 1, and gauge resistor 6 is formed in second substrate 2. Accordingly, the pressure measuring accuracy can be improved.

Furthermore, diaphragm 5 can be formed by grinding second substrate 2 without being affected by variations in the depth of concave portion 3, because concave portion 3 is formed in first substrate 1 and diaphragm 5 is formed in second substrate 2. Thus, the accuracy in thickness of diaphragm 5 can be improved. Accordingly, the pressure measuring accuracy can be improved.

In addition, alignment mark 4 can be visually identified because second substrate 2 is provided to expose alignment mark 4. This eliminates the need of an IR aligner. Accordingly, the production cost can be reduced.

In addition, the pattern accuracy of alignment can be ensured, and the alignment accuracy is therefore not reduced, because alignment mark 4 is formed at main surface 1a of first substrate 1. Thus, the registration accuracy for gauge resistor 6 can be improved. Accordingly, the pressure measuring accuracy can be improved.

In addition, the cost and time required to form alignment mark 4 can be reduced as compared with the case where alignment mark 4 is formed to pass through second substrate 2, because alignment mark 4 is formed at main surface 1a of first substrate 1. Accordingly, the production cost can be reduced.

In addition, the registration accuracy for gauge resistor 6 can be improved by using alignment mark 4 as a reference for registering gauge resistors 6, because first substrate 1 has alignment mark 4 formed at main surface 1a. Accordingly, the pressure measuring accuracy can be improved. In particular, the improvement of positional accuracy of gauge resistor 6 with respect to diaphragm 5 can reduce variations of sensor output at a pressure of zero (that is, offset output).

The method of manufacturing a semiconductor pressure sensor in an embodiment of the present invention further includes the step of forming metal wiring electrically connected to the gauge resistor using the exposed alignment mark. Accordingly, the registration accuracy for metal wiring can be improved. The improvement of registration accuracy for metal wiring can prevent a pressure measurement error due to a positional shift of the metal wiring. Accordingly, the pressure measuring accuracy can be improved.

In the method of manufacturing a semiconductor pressure sensor in an embodiment of the present invention, alignment mark 4 is formed at outer peripheral portion 1b of first substrate 1 in a wafer state. The provision of alignment mark 4 at outer peripheral portion 1b that is not an effective area can increase the number of effective chips.

In the method of manufacturing a semiconductor pressure sensor in an embodiment of the present invention, the width of outer peripheral portion 1b is 5 mm or less from outer circumferential end 1c of first substrate 1 in a wafer state. Thus, the recognition of alignment mark 4 by a stepper is compatible with the maximization of effective chip area. The reason is as follows. As for the visual identification of alignment mark 4 by a stepper, alignment mark 4 can be recognized better as it is arranged on the more inner circumferential side of first substrate 1. On the other hand, second substrate 2 lying on the alignment mark should be removed in order to expose the alignment mark. Therefore, the effective chip area is reduced as alignment mark 4 is arranged on the more inner circumferential side of first substrate 1. Moreover, the portion where second substrate 2 is removed becomes a steep and big step. As a result, gauge resistors 6, oxide film 7, metal wiring 8, etc. to be formed subsequently may be deteriorated in the coverage shape or stripped away. As a result of elaborate experiments, the present inventors have found that the recognition of alignment mark 4 by a stepper is compatible with the maximization of effective chip area if alignment mark 4 is arranged in the terrace portion and if the size of width of outer peripheral portion 1b is in a range within 5 mm from the outer circumferential end of first substrate 1.

In the method of manufacturing a semiconductor pressure sensor in an embodiment of the present invention, alignment mark 4 is exposed by etching second substrate 2 after grinding second substrate 2. Accordingly, it is possible to prevent alignment mark 4 from disappearing due to grinding of second substrate 2 and further grinding of even first substrate 1. Furthermore, the process time can be shortened, for example, by cutting using a grinder using a grinding wheel in addition to etching requiring a long process time, thereby improving the production efficiency.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor pressure sensor comprising:
   a first substrate having a concave portion and a plurality of alignment marks at a main surface thereof; and
   a second substrate formed on said main surface of said first substrate and having a diaphragm provided to cover a space inside said concave portion of said first substrate and a gauge resistor provided on said diaphragm,
   wherein said plurality of alignment marks is provided to be exposed from said second substrate, and wherein the first substrate further comprises an oxide film formed on a surface of the concave portion and the alignment marks.

2. The semiconductor pressure sensor according to claim 1, wherein
   said first substrate is in a wafer state, and
   said plurality of alignment mark is provided at an outer peripheral portion of said first substrate in said wafer state.

3. The semiconductor pressure sensor according to claim 1, wherein said gauge resistor is arranged at a position overlapping with an outer edge of said concave portion as viewed from a direction in which said first substrate and said second substrate overlap each other.

4. A method of manufacturing a semiconductor pressure sensor comprising the steps of:
   preparing a first substrate having a concave portion and an alignment mark formed at main surface thereof;
   forming a second substrate on said main surface of said first substrate so as to have a diaphragm covering a space inside said concave portion and to expose said alignment mark; and
   forming a gauge resistor on said diaphragm using said exposed alignment mark.

5. The method of manufacturing a semiconductor pressure sensor according to claim 4, further comprising the step of forming metal wiring electrically connected to said gauge resistor using said exposed alignment mark.

6. The method of manufacturing a semiconductor pressure sensor according to claim 4, wherein said alignment mark is formed at an outer peripheral portion of said first substrate in a wafer state.

7. The method of manufacturing a semiconductor pressure sensor according to claim 6, wherein a width of said outer peripheral portion is 5 mm or less from an outer circumferential end of said first substrate in said wafer state.

8. The method of manufacturing a semiconductor pressure sensor according to claim 4, wherein said step of forming a second substrate includes the steps of:
   grinding said second substrate; and
   exposing said alignment mark by etching said second substrate after grinding said second substrate.

* * * * *